US006768647B1

(12) United States Patent
Kowtun et al.

(10) Patent No.: US 6,768,647 B1
(45) Date of Patent: Jul. 27, 2004

(54) WIRELESS RF/SERIAL REMOTE ZONE CONNECTOR AND SYSTEM

(75) Inventors: Peter Kowtun, Plymouth, MI (US); Qingfeng Tang, Novi, MI (US)

(73) Assignee: Lear Corporation, SouthField, MI (US)

( * ) Notice: Subject to any disclaimer, the term of this patent is extended or adjusted under 35 U.S.C. 154(b) by 0 days.

(21) Appl. No.: 10/249,155

(22) Filed: Mar. 19, 2003

(51) Int. Cl.[7] .................................................. H05K 5/00
(52) U.S. Cl. ........................ 361/752; 361/760; 439/76.1
(58) Field of Search ................................. 361/752, 748, 361/760, 785, 796; 439/76.1, 76.2, 709, 638, 83

(56) References Cited

U.S. PATENT DOCUMENTS 6,547,133 B1 * 4/2003 DeVries et al. ............. 235/380
6,583,902 B1 * 6/2003 Yuen .......................... 398/135
6,622,502 B2 * 9/2003 Yeo ............................. 62/179

FOREIGN PATENT DOCUMENTS

FR 2696384 * 10/1992

* cited by examiner

*Primary Examiner*—David Martin
*Assistant Examiner*—Thanh S Phan
(74) *Attorney, Agent, or Firm*—Bill Panagos, Esq.

(57) ABSTRACT

A remote zone connector circuit (16) includes a circuit board (36) that has an onboard circuit (38) with a node (90) that is configured for an electronic device. Multiple electrical connections (40) are electrically coupled to the circuit board (36). A remote zone connector housing (42) securely retains the circuit board (36) and engages with the electrical connections (40). A remote zone connector transceiver (27) is coupled to the circuit board (36) and transmits and receives signals to and from the electronic device.

20 Claims, 3 Drawing Sheets

WIRELESS RF/SERIAL REMOTE ZONE CONNECTOR AND SYSTEM

CROSS REFERENCE TO RELATED APPLICATIONS

The present invention is related to U.S. patent application Ser. No. 10/249,129, filed Mar. 18, 2003, and entitled "Remote Zone Connector and System", which is incorporated by reference herein.

BACKGROUND OF INVENTION

The present invention, relates to electrical and electronic system architecture and componentry, and more particularly, to an apparatus and system for remotely coupling to and controlling various devices within a vehicle.

Modern vehicles include various electronic components and control systems providing many electrically controlled features. Some of the features relate to operation of a vehicle, such as operation of a powertrain, steering system, or braking system, whereas others enhance occupant convenience, such as power seat systems, door lock control systems, and heating ventilation air conditioning HVAC control systems. Typically, a designated controller or a central controller, which is sometimes referred to as a module, controls operation of the features.

A module often includes a microprocessor having processing circuitry, input biasing and protection circuitry, and output power switching capability. The module may control devices, such as motors, and receive data from corresponding sensors. In order to operate the motors multiple high current drivers are included within the module. The devices and the sensors are coupled to the module by multiple conductors. Depending on location of the devices relative to the module, a large quantity of parallel conductors may be routed throughout the vehicle in the form of cables or in the form of a vehicle harness. Due to an abundant amount of conductors the cabling or vehicle harness may have considerable weight and complexity.

The amount of electronic and electrical features within a vehicle are continuously increasing. With ever increasing electrical and electronic features comes increased cable and vehicle harness weight and complexity. Thus, there is a desire to increase design and operation flexibility and to minimize weight and complexity of vehicle electrical systems.

It has been suggested in U.S. Pat. No. 6,198,244 B1, entitled "Electronic Architecture for Controlling an Electronic Seat", to partition a vehicle into regions each region having a designated controller and any number of local networks. The local networks are coupled to their assigned or designated controllers. Each local network includes a series of serially coupled dumb connectors or smart connectors, each of which being coupled to a respective electronic device, such as a motor, a heater, or a sensor. A dumb connector is coupled to a smart device and a smart connector is coupled to a dumb device.

Although, the '244 patent may simplify the size and weight of a main vehicle or input harness, the '244 patent continues to utilize a substantial input harness and has other associated disadvantages. The input harness couples the regional controllers to a separate fuse block, containing interrupt circuitry, the combination thereof being of considerable weight that is undesirable. The '244 patent also utilizes a large quantity of regional controllers, and an even larger quantity of smart detectors. Each smart connector is assigned to a single designated and separate electronic device. Since there is a large quantity of smart connectors additional associated weight is included therein. Thus, the electrical system of the '244 patent is not only relatively heavy but is also relatively complex due to the relatively large quantity of components.

With a large vehicle harness or with a large quantity of components generally comes an undesirable large quantity of cabling between components. As known in the art, it is desirable to minimize the amount of cables within a vehicle, due to system complexity and costs. To minimize cabling, current systems are somewhat location limited in design with respect to positioning of various controllers relative to the smart devices and dumb devices, generally requiring the controllers to be centrally located or closer in proximity to a majority of the system components.

It is therefore desirable to provide an apparatus and system for remotely coupling to and controlling various devices within a vehicle that is relatively simple in design, lightweight, and inexpensive, and it is further desirable that the apparatus and system minimize number of system components and provide component design location versatility and ease in manufacturing of a vehicle.

SUMMARY OF INVENTION

The present invention addresses the issues described above and provides an apparatus and system for remotely coupling to and controlling various devices within a vehicle. A remote zone connector circuit is provided and includes a circuit board that has an onboard circuit with a node that is configured for an electronic device. Multiple electrical connections are electrically coupled to the circuit board. A remote zone connector housing securely retains the circuit board and engages with the electrical connections. A transceiver is coupled to the circuit board and transmits and receives signals to and from the electronic device.

One of several advantages of the present invention is that it provides a remote zone connector that is capable of controlling multiple devices having various capability levels.

Another advantage of the present invention is that it eliminates need of a main vehicle harness or input harness and provides a remote zone connecting system that utilizes one or more remote zone connectors. In so doing the present invention is simple in design, relatively lightweight, and inexpensive to manufacture.

Furthermore, the present invention minimizes impact of adding new electronic or electrical features to a vehicle electrical system. In utilizing the present invention an electronic or electrical feature may be added to the architecture of the present invention with minimal increase in electrical components.

Moreover, the present invention eliminates use of transmission lines between the remote zone connector and other electronic devices. In so doing, the present invention further simplifies system design and provides increased component location versatility.

The present invention itself, together with further objects and attendant advantages, will be best understood by reference to the following detailed description, taken in conjunction with the accompanying drawing.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
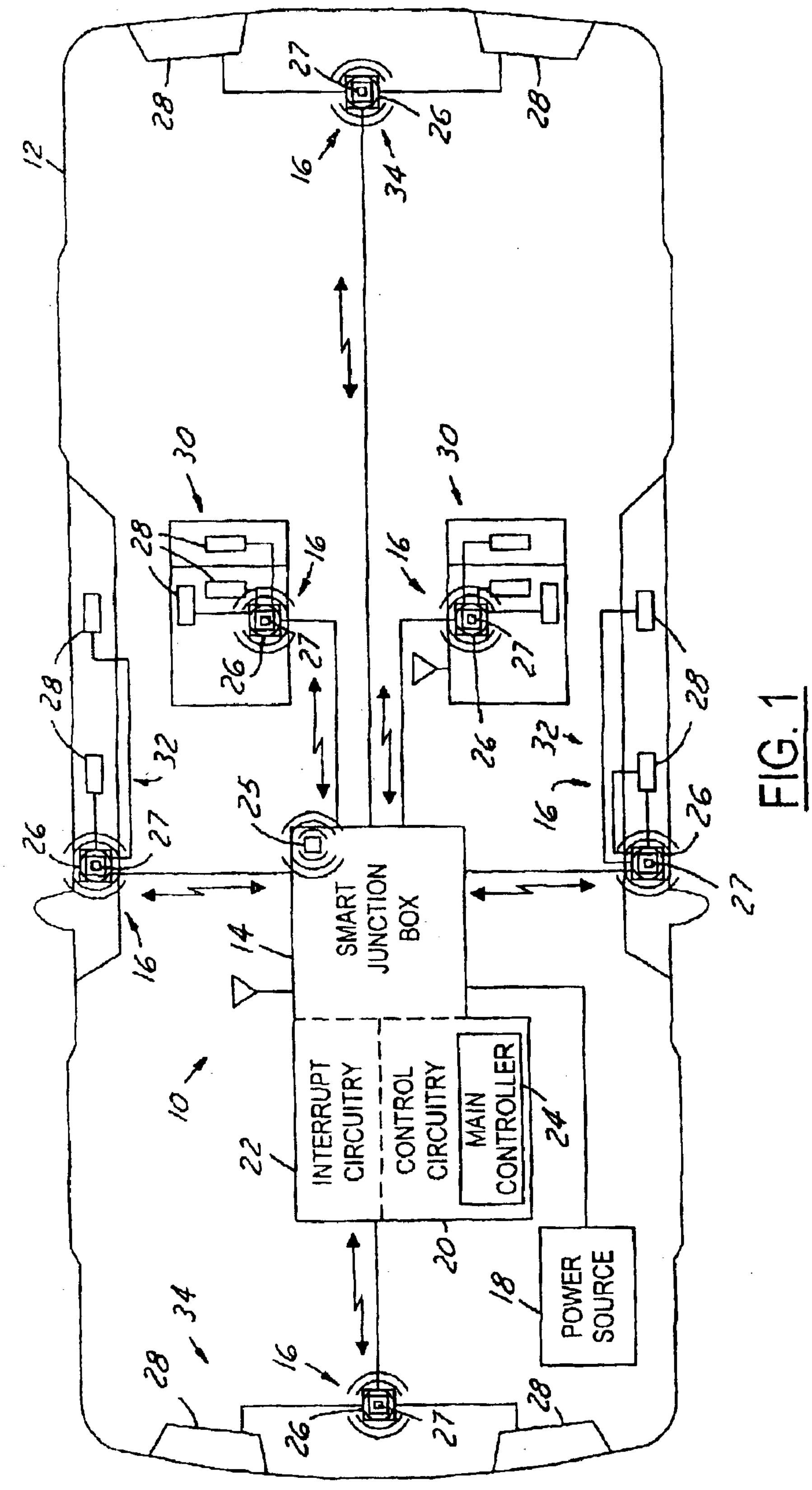
FIG. 1 is a block diagrammatic view of a remote zone connecting system in accordance with an embodiment of the present invention.

In the following figures the same reference numerals will be used to refer to the same components. While the present invention is described with respect to apparatus and system for remotely coupling to and controlling various devices within a vehicle, the present invention may be adapted and applied to various systems including: electrical systems, door systems, headliner systems, heating systems, seating systems, lighting systems, vehicle systems, non-vehicle electrical systems, or other systems known in the art. The present invention may also be applied to instrument panels, trunk areas, window and roof motors and switches, electronic clusters, and other electronic devices known in the art.

In the following description, various operating parameters and components are described for one constructed embodiment. These specific parameters and components are included as examples and are not meant to be limiting.

Referring now to FIG. 1, a block diagrammatic view of a radio frequency (RF)/serial remote zone connecting system 10 for a vehicle 12 in accordance with an embodiment of the present invention is shown. The remote zone connecting system 10 includes a smart junction box 14 and multiple wireless RF/serial remote zone connector circuits 16. Although, a smart junction box is shown some other form of electronic control module known in the art may be used, such as a body controller. The smart junction box 14 supplies power from a power source 18 to the RF circuits 16. The smart junction box 14 has control circuitry 20 for operating multiple electronic and electrical features associated with each RF circuit 16.

The smart junction box 14 includes interrupt circuitry 22 and a main controller 24, within the control circuitry 20. The interrupt circuitry 22 may be in the form of fuses or sensors, may be software driven, or may be in some other form of interrupt or protection circuitry known in the art. The interrupt circuitry 22 provides short circuit protection. The main controller 24 is preferably microprocessor based such as a computer having a central processing unit, memory (RAM and/or ROM), and associated input and output buses. The main controller 24 may perform load switching, load diagnosis, load current and data acquisition, load current controlled pulse width modulation, and other known tasks known in the art. Although, the smart junction box 14 is shown as and is preferably a single unit it may be separated into individual components.

The smart junction box 14 also includes a control module or smart junction box transceiver 25 that is in communication with remote zone transceivers 27 of the RF circuits 16. The transceivers 25 and 27 are radio frequency based and may have wired or wireless communication capability. The transceivers 25 and 27 may have antennas, such as antennas 29 for wireless communication between the smart junction box 14 and the RF circuits 16.

The RF circuits 16 also include multiple RF/serial remote zone connectors 26, which are coupled to the smart junction box 14 and to multiple electronic or electronic devices 28. In one embodiment of the present invention it is preferred that the remote zone connectors 26 receive and supply power from the smart junction box 14 to the devices 28, as shown. On the other hand, the remote zone connectors 26 may receive power other than from the smart junction box 14 and the devices 28 may receive power other than from the remote zone connectors 26, whereby any direct electrical connection between the smart junction box 14, the remote zone connectors 26, and the devices 28 may be eliminated.

In operation, the smart junction box 14 determines a desired state of a device, such as devices 28, and generates and transmits control signals to the remote zone connectors 26, via the transceiver 25. In response to the control signals the remote zone connectors 26 either generate command signals or directly operate the devices 28. The remote zone connectors 26 may receive status signals from the devices 28 and relay the status signals to the main controller 24. Status signals may contain vehicle internally related information, such as internal actuator positions, internal temperatures, velocity or may contain externally related information, such as object detection information including object position, range, and velocity relative to the vehicle 12.

The devices 28 may have various capability levels; each device may be considered to be a smart device, a semi-smart device, a dumb device, or a device of some other capability level known in the art. A smart device, in general, contains electronics for relatively more complex functions such as serial data communication to and from the smart device and power switching. A smart device is typically able to perform computational functions. A dumb device on the other hand, typically receives power and possibly data and operates with minimal or basic electronics. A dumb device, in general, is not capable of performing computational functions. A semi-smart device, such as a seat motor having a built in driver, is neither considered a smart device or a dumb device since it ordinarily performs minimal computations and often does not perform any computations, but yet has electronics of a somewhat higher level of complexity than that of a dumb device.

Although, in FIG. 1 the present invention is shown as being applied to vehicle seat systems 30, door systems 32, and lighting systems 34, FIG. 1 is intended to be for example purposes only. Of course, the present invention may be applied to various other systems and devices.

Figure 2A:
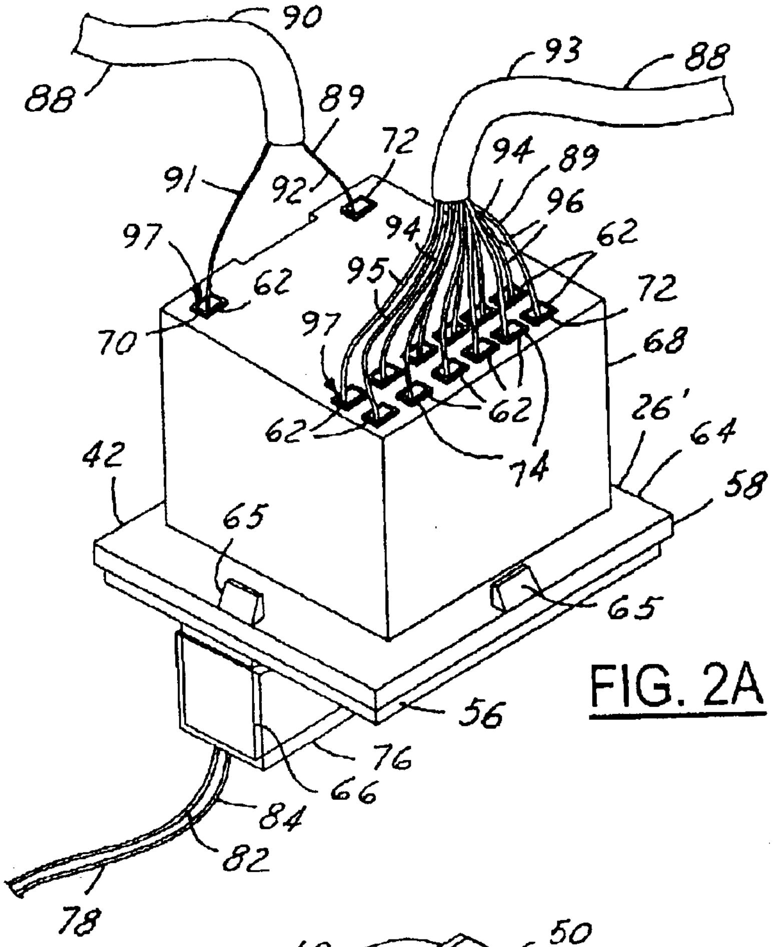
FIG. 2A is a perspective view of an RF remote zone connector in accordance with an embodiment of the present invention.
Figure 2B:
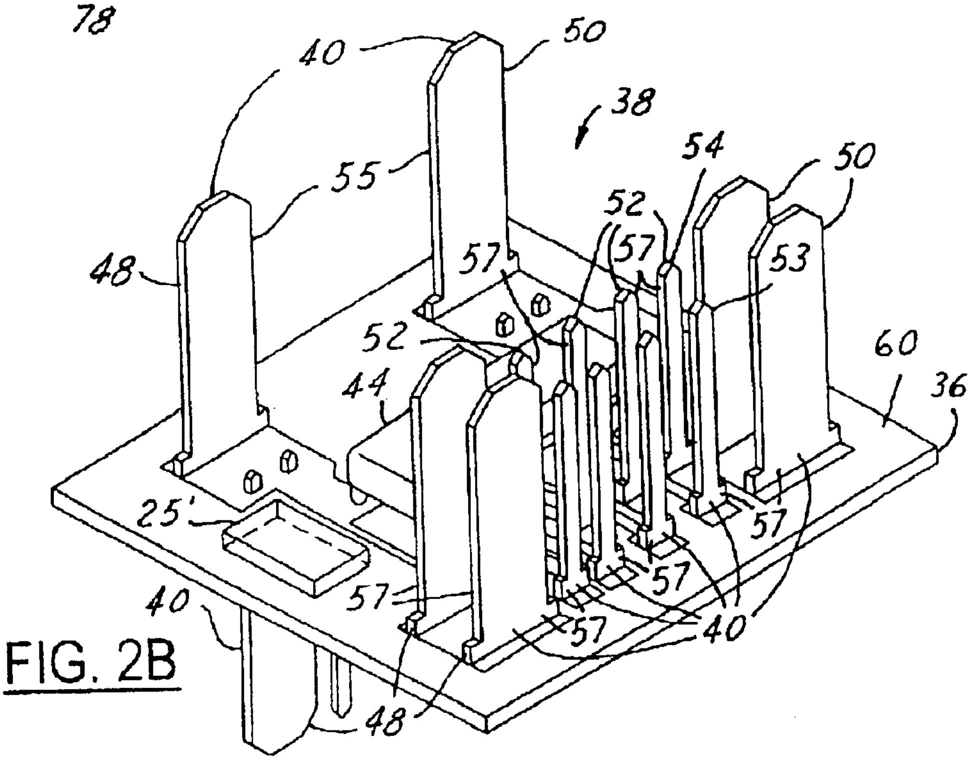
FIG. 2B is a perspective view of a circuit board for the RF remote zone connector of FIG. 2A in accordance with an embodiment of the present invention.

Referring now to FIGS. 2A and 2B, perspective views of an RF/serial remote zone connector 26' and of a corresponding circuit board 36 are shown in accordance with an embodiment of the present invention. The RF remote zone connector 26' includes the circuit board 36 that has an onboard circuit 38 and a remote zone connector transceiver 25'. Multiple electrical connections 40 are coupled to the circuit board 36. A remote zone connector housing 42 securely retains the circuit board 36 and the transceiver 25' and engages with the electrical connections 40.

The onboard circuit 38 includes one or more integrated circuit devices 44 (only one is utilized in this example) and the electrical connections 40. The integrated circuit 44 may perform serial data communication, computational functions, power switching, or other tasks or functions known in the art. The electrical connections 40 include power connections 48, ground connections 50, and receive and transmit or control connections 52. Some of the control connections 52 may be feedback connections 53 or spare connections (not shown). Although, all the connections 40 are shown as being of some form of a male connection they may be of some other connection form(s) known in the art.

Note that the onboard circuit 38 may be modified for various electronic devices in that any number and type of electrical connections 40 may be utilized. The embodiment of FIGS. 2A and 2B illustrated this by being configured for three devices and corresponding electrical connections 40. A first device (not shown) is coupled to power and ground connections 55 whereas a second device and a third device (also not shown) are coupled to power, ground, and control connections 57.

The remote zone housing 42 includes a supply side housing 56 and a control side housing 58 that rigidly mate to an outer periphery 60 of the circuit board 36. The supply side housing 56 and a control side housing 58 each have multiple female receptacle slots 62 that engage with the electrical connections 40. The female receptacles 62, again are shown as one possible example of a connection that may be used to engage with the electrical connections 40. The supply side housing 56 and the control side housing 58 have overlapping lips 64 with snapping fasteners 65 for coupling over the outer periphery 60 and rigidly fastening the supply side housing 56 to the control side housing 58. The supply side housing 56 and the control side housing 58 may be coupled to each other using methods other than the fasteners 65, as known in the art. The overlapping lips 64 prevent the circuit board 36 from moving within the remote zone housing 42 and aids in maintaining connection between the electrical connections 40 and the receptacle slots 62. The outer periphery 60 is non-conductive and is conducive for mating to the housing 42.

The supply side housing 56 includes a supply mating section 66 and the control side housing 58 includes one or more device mating sections 68 (only one is utilized in this example). The supply mating section 66 and the device mating section 68 may be on separate sides of the remote zone connector 26', as shown, so as to provide a "through" connection configuration, may be on the same side, may be in a combination thereof, or may be in some other configuration known in the art. The mating sections 66 and 68 include power connections 70, ground connections 72, and control connections 74.

Figure 3:
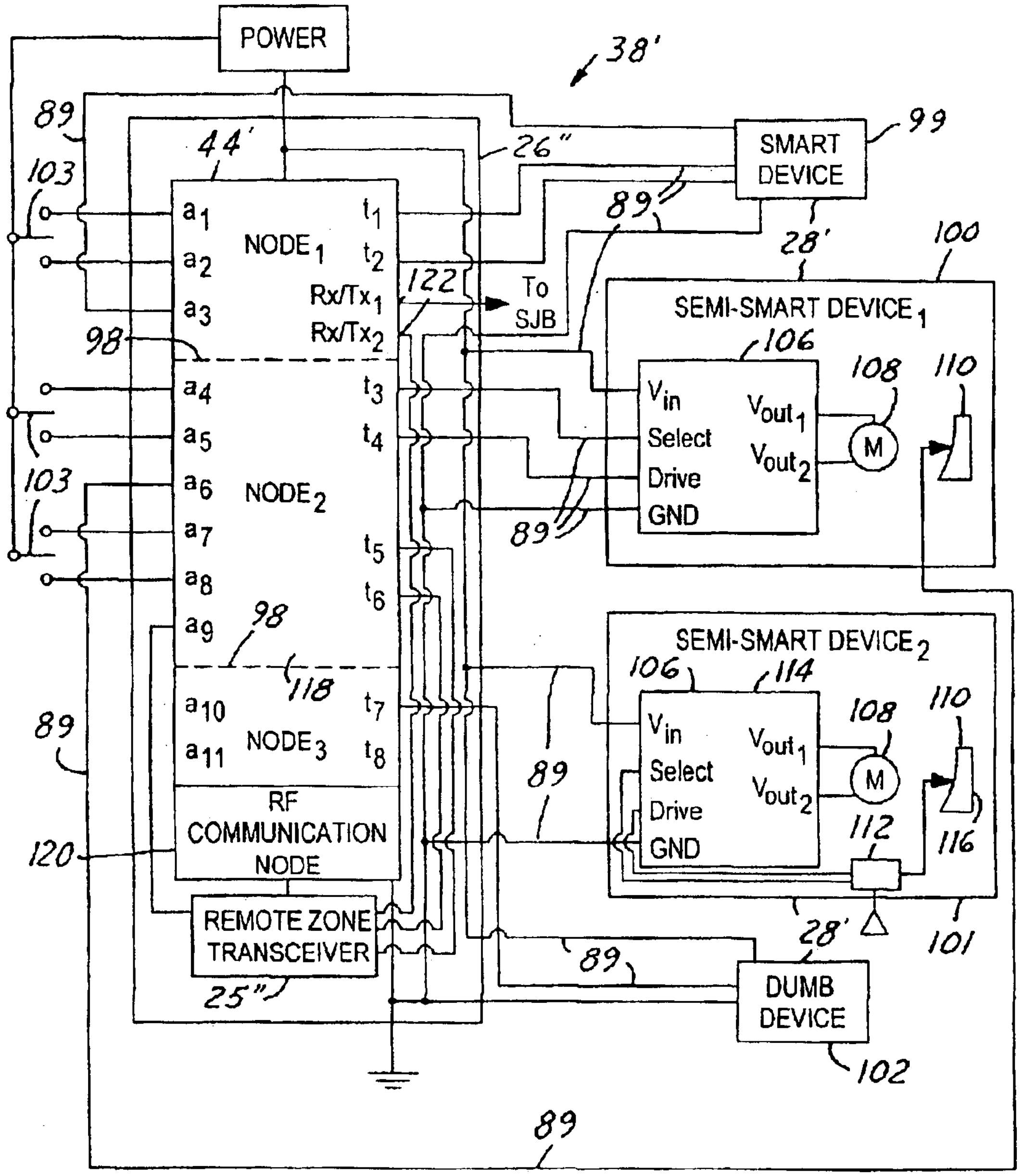
FIG. 3 is a schematic view of a remote zone connector circuit in accordance with an embodiment of the present invention.

The supply mating section 66 mates to a supply connector 76 of a serial input cable 78. The serial input cable 78 contains a power line 82, and a ground line 84. The device mating section 68 mates to one or more control cables 88. Each control cable 88 may include one or more serial drive lines, power lines, and ground lines, which are best illustrated by the schematic of FIG. 3 and represented by lines 89. For example, cable 90 only has a single power line 91 and a single ground line 92 whereas cable 93 has multiple drive lines 94, power lines 95, and ground lines 96. Also, the integrated circuit 44 may be communication with a device (not shown) that is not receiving power from the onboard circuit 38, via transceiver 25", such as a device similar to devices 28.

The lines 89 may have terminals (not shown) crimped thereon and engage into cavities 97 The lines 89 may have terminals (not shown) crimped thereon and engage into cavities 97 or have respective connector (not shown) mating to the control side housing 58, where they are then electrically coupled to some of the electrical connections 40. The supply cable 78 and the control cables 88 may be mated to a single connector (not shown) and have a corresponding single mating section (not shown) on the remote zone connector 26'.

Referring now to FIG. 3, a schematic view of an RF remote zone connector circuit 38' in accordance with an embodiment of the present invention is shown. The remote zone circuit 38' includes an RF remote zone connector 26" with an integrated circuit device 44', a remote zone connector transceiver 25", and multiple devices 28'. The integrated circuit 44' may have any number of nodes 98 and be coupled to any number of devices, such as devices 28'. The devices 28' again may have various capability levels. For example purposes only, a smart device 99, a first semi-smart device 100, a second semi-smart device 101, and a dumb device 102 are coupled to respective nodes 98 of the integrated circuit 44' and may have respective operating switches 103. Note, that the devices 28" are parallely connected to the remote zone connector 26".

The semi-smart devices 100 and 101, being of the same status level and servicing similar purposes, share a common node, thereby, simplifying the integrated circuit 44'. Each of the semi-smart devices 100 and 101 include a driver 106, a motor 108, and a position sensor 110 for determining position of actuated members (not shown). For example, the motors 108 may be within a seat system, such as seat systems 32, and control actuated members contained therein to adjust seat positioning.

The semi-smart device 101 also includes a device transceiver 112 that is electrically coupled to the driver 114 and the position sensor 116. The transceiver 112 is in communication with the remote zone transceiver 25" and eliminates use of electrical communication transmission connections, between the circuit 44' and the driver 114.

To further minimize the number of components the semi-smart device as well as other devices receiving power from the circuit 44' may use power and ground connections, such as connections 113 for communication therebetween. In so doing, the present invention eliminates the need for a separate transmission line and the use of transceivers 25" and 112. A communication signal may be superimposed on the power a ground lines 113, having a designated frequency, which may be a RF. For example, in one embodiment of the present invention the power connections are direct current (DC) power lines and the communication signals have a designated RF frequency and are superimposed over the DC power on the power lines.

The nodes 98 are configured for each of the electronic devices 28' to account for the various capability levels and purposes of each device. The nodes 98 may be in the form of a local interconnect network node, a car area network node. a flexible firmware routine node, or in some other form of communication node known in the art. The nodes 98 may be configured and have software contained therein so as to be shared by multiple electronic devices, as illustrated by a second node 118 and the semi-smart devices 100 and 101.

Each node 98 may be configured for RF communication between a smart junction box and the devices 28" or the integrated circuit 44" may include a separate RF communication node 120 that may be used for RF communication. Note also that in the embodiment of FIG. 3 the integrated circuit 44" has a pair of transmission connections 122 for communication via cable or wireless RF communication to a smart junction box or other controller. Thus, the integrated circuit 44" may be configured to be in wired or wireless communication with any number of electronic devices.

The present invention provides for simple and easy reconfiguration of an electrical system for new electrical features and associated electronic devices. Instead of requiring incorporation of additional conductors, connectors, modules, etc., as in the prior art, simple software changes to a smart junction box and to an integrated circuit of a remote zone connector are all that may be needed. Thus, the present invention exhibits minimal weight increases with increase in electronic features; weight increases are primarily from the new electronic devices themselves. When a new electronic feature is added to a remote zone connecting system of the present invention software of one or more existing nodes is adjusted or a new node is added. As stated above, when similar devices that serve similar purposes are used the devices may share a single node.

The present invention provides a versatile remote zone connector and remote zone connecting system that may be utilized in various electronic and electrical applications. The present invention is relatively simple and lightweight in design and inexpensive to manufacture.

The present invention also minimizes not only size and existence of a vehicle harness but also minimizes amount of cabling within a vehicle by eliminating need for transmission or control lines between a smart junction box, remote zone connectors, other electronic devices, and the like. Additionally, the present invention increases control module location versatility due to the reduction in cabling.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A remote zone connector circuit comprising:

a circuit board having an onboard circuit with at least one node that is configured for at least one electronic device that is separate from said circuit board;

a plurality of electrical connections electrically coupled to said circuit board and at least one of said at least one electrical device;

a remote zone connector housing securely retaining said circuit board and engaging with said plurality of electrical connections; and a remote zone connector transceiver coupled to said circuit board and transmitting and receiving signals to and from said at least one electronic device.

2. A connector as in claim 1 wherein said onboard circuit comprises at least one integrated circuit device.

3. A connector as in claim 1 wherein said remote zone connector in transmitting and receiving signals transmits and receives signals superimposed over a power or ground connection.

4. A connector as in claim 1 wherein said at least one node is configured to be shared by a plurality of electronic devices.

5. A connector as in claim 1 wherein said at least one node comprises:

a first node that is configured for a first electronic device; and a second node that is configured for a second electronic device.

6. A connector as in claim 1 wherein said plurality of electrical connections comprise:

a plurality of power connections;

a plurality of ground connections; and a plurality of control connections.

7. A connector as in claim 1 wherein said plurality of electrical connections comprise at least one feedback connection.

8. A connector as in claim 1 wherein said transceiver is securely retained within said remote zone connector housing.

9. A connector as in claim 1 wherein said remote zone connector housing comprises:

a supply side housing; and a control side housing.

10. A connector as in claim 1 wherein said at least one electronic device is an electronic control module.

11. A connector as in claim 10 wherein said at least one electronic device is a device selected from at least one of a dumb device, a semi-smart device, and a smart device.

12. A connector as in claim 1 further comprising at least one device mating section comprising;

at least one power connection;

at least one ground connection; and at least one control connection.

13. A connector as in claim 1 wherein said remote zone connector housing rigidly mates to an outer periphery of said circuit board.

14. A remote zone connecting system comprising:

an electronic control module electrically coupled to a control module transceiver; and at least one remote zone connector circuit comprising;

at least one electronic device;

at least one remote zone connector transceiver; and at least one remote zone connector electrically coupled to at least one electronic device and to said at least one remote zone connector transceiver, said at least one remote zone connector receiving signals from said control module transceiver for operational control of said at least one electronic device.

15. A system as in claim 14 wherein said at least one remote zone connector comprises at least one circuit board having an onboard circuit comprising:

a first transmission connection in wired communication with at least one electronic control module; and a second transmission connection in wireless communication with said at least one electronic control module.

16. A system as in claim 14 wherein said at least one remote zone connector comprises:

at least one circuit board having an onboard circuit with at least one node that is configured for said at least one electronic device;

a plurality of electrical connections electrically coupled to said at least one circuit board; and at least one remote zone connector housing securely retaining said at least one circuit board and engaging with said plurality of electrical connections, said at least one remote zone connector housing comprising;

at least one supply mating section; and at least one device mating section.

17. A system as in claim 16 wherein said at least one remote zone connector transceiver witlessly transmits and receives signals to and from said at least one electronic device.

18. A system as in claim 16 wherein said at least one remote zone connector is coupled to said at least one electronic device via at least one serial drive line.

19. A system as in claim 16 wherein said at least one remote zone connector is coupled to said at least one electronic device via a mini-harness.

20. An radio frequency remote zone connector comprising:

a circuit board having an onboard circuit with at least one node that is configured for at least one electronic device, which is separate from said circuit board and has a capability level of at least semi-smart;

a plurality of electrical connections electrically coupled to said circuit board and at least one of said at least one electrical device and comprising;

a plurality of power connections;

a plurality of ground connections; and a plurality of control connections;

a radio frequency transceiver electrically coupled to a transmission connection of said circuit board and engaging with said plurality of control connections; and a remote zone connector housing securely retaining said circuit board and said radio frequency transceiver and engaging with said plurality of power connections and said plurality of ground connections, said remote zone connector housing comprising;

a supply mating section; and at least one device mating section.

* * * * *